(12) United States Patent
Kato

(10) Patent No.: US 12,114,432 B2
(45) Date of Patent: Oct. 8, 2024

(54) ELECTRONIC DEVICE AND METHOD FOR MANUFACTURING THE SAME

(71) Applicant: Murata Manufacturing Co., Ltd., Nagaokakyo (JP)

(72) Inventor: Noboru Kato, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 308 days.

(21) Appl. No.: 17/656,491

(22) Filed: Mar. 25, 2022

(65) Prior Publication Data

US 2022/0217879 A1 Jul. 7, 2022

Related U.S. Application Data

(63) Continuation of application No. PCT/JP2020/037708, filed on Oct. 5, 2020.

(30) Foreign Application Priority Data

Mar. 6, 2020 (JP) .................. 2020-038332

(51) Int. Cl.
H05K 13/04 (2006.01)
H05K 13/00 (2006.01)

(52) U.S. Cl.
CPC ....... H05K 13/046 (2013.01); H05K 13/0015 (2013.01)

(58) Field of Classification Search
CPC ......................... H05K 13/046; H05K 13/0015
USPC ....................................................... 361/760
See application file for complete search history.

(56) References Cited

U.S. PATENT DOCUMENTS

| | | | | |
|---|---|---|---|---|
| 2005/0224561 A1* | 10/2005 | Kurasawa | ........... | G02F 1/13452 257/E23.179 |
| 2007/0086174 A1* | 4/2007 | Minamio | ............... | H05K 3/284 361/761 |
| 2017/0083804 A1 | 3/2017 | Kato et al. | | |

FOREIGN PATENT DOCUMENTS

| | | |
|---|---|---|
| JP | S6350169 S | 4/1988 |
| JP | 2005064303 A | 3/2005 |
| JP | 2018049982 A | 3/2018 |
| WO | 2016084658 A1 | 6/2016 |

OTHER PUBLICATIONS

International Search Report issued for PCT/JP2020/037708, date of mailing Dec. 15, 2020.
Written Opinion of the International Searching Authority issued for PCT/JP2020/037708, date of mailing Dec. 15, 2020.

\* cited by examiner

*Primary Examiner* — Andargie M Aychillhum
(74) *Attorney, Agent, or Firm* — ArentFox Schiff LLP

(57) ABSTRACT

An electronic device is provided with an electronic component having a base material and a terminal electrode formed on a first surface of the base material, and a circuit substrate in which a pad for mounting the electronic component is formed on a first surface. A hole for light transmission is formed in the pad, and the pad and the terminal electrode are electrically and mechanically connected to each other with a cured product of optical firing paste obtained by receiving light from a second surface that is a surface opposite to the first surface of the circuit substrate.

16 Claims, 12 Drawing Sheets

ELECTRONIC DEVICE AND METHOD FOR MANUFACTURING THE SAME

CROSS REFERENCE TO RELATED APPLICATIONS

The present application is a continuation of PCT/JP2020/037708 filed Oct. 5, 2020, which claims priority to Japanese Patent Application No. 2020-038332, filed Mar. 6, 2020, the entire contents of each of which are incorporated herein by reference.

TECHNICAL FIELD

The present invention relates to an electronic device configured with a circuit substrate and an electronic component mounted on the circuit substrate, and a method for manufacturing the electronic device.

BACKGROUND

In general, an electronic device can be configured with an electronic component having a base material and a terminal electrode formed on the base material, and a circuit substrate on which a pad for mounting the electronic component is formed.

For example, an electronic circuit module configured by mounting various chip components on a module substrate is mounted on a main circuit substrate or a circuit substrate having a relatively large area, so that various electronic devices are configured.

As one specific example, a radio frequency identifier (RFID) tag to be attached to an article includes an RFIC module configured by mounting an RFIC on a module substrate on which an impedance matching circuit is formed, and a substrate on which an antenna pattern is formed, and is configured by mounting the RFIC module on the substrate.

WO 2016/084658 A (hereinafter "Patent Literature 1") discloses an RFID tag including a conductor that acts as an antenna, and an RFIC module coupled to the conductor. Such an RFID tag includes an RFIC chip that stores predetermined information and processes a predetermined wireless signal, and an antenna element (e.g., a radiator) that transmits and receives a high-frequency signal, and is used by being affixed to various articles (or packaging materials therefor) to be managed.

When an electronic component configured with a module substrate is mounted on a circuit substrate, a terminal electrode formed on a lower surface of the electronic component is soldered to a pad formed on the circuit substrate. For the soldering, solder paste printing and reflow soldering are performed. However, the production throughput thereof is not high, which is a problem in terms of improving the mass productivity.

SUMMARY OF THE INVENTION

Accordingly, it is an object of the present invention to provide an electronic device configured with an electronic component having a base material and a terminal electrode formed on the base material, and a circuit substrate on which a pad for mounting the electronic component is formed, in which manufacturing efficiency is improved, and a method for manufacturing the electronic device.

In an exemplary aspect, an electronic device is provided that includes an electronic component having a base material and a terminal electrode formed on a first surface of the base material; and a circuit substrate in which a pad for mounting the electronic component is formed on a first surface. Moreover, a hole for light transmission is formed in the pad, and the pad and the terminal electrode are electrically and mechanically connected to each other with a cured product of optical firing paste obtained by receiving light from a second surface that is a surface opposite to the first surface of the circuit substrate.

In another exemplary aspect, an electronic device is provided that includes an electronic component having a base material and a terminal electrode formed on a first surface of the base material; and a circuit substrate in which a pad for mounting the electronic component is formed on a first surface. Moreover, the electronic component has a through hole extending from the first surface of the base material of the electronic component to a second surface that is a surface opposite to the first surface of the base material of the electronic component, including the terminal electrode, and the pad and the terminal electrode, which are electrically and mechanically connected to each other with a cured product of optical firing paste obtained by receiving light from the second surface of the base material of the electronic component.

In another exemplary aspect, an electronic device is provided that includes an electronic component having a base material and a terminal electrode formed on a first surface of the base material; and a circuit substrate in which a pad for mounting the electronic component is formed on a first surface. Moreover, the base material is configured with a light transmissive material that transmits ultraviolet light, a hole for light transmission is formed in the terminal electrode, and the pad and the terminal electrode are electrically and mechanically connected to each other with a cured product of optical firing paste obtained by receiving light from the second surface of the base material of the electronic component.

In yet another exemplary aspect, a method is provided for manufacturing an electronic device by mounting on a circuit substrate an electronic component having a base material and a terminal electrode formed on a first surface of the base material. In this aspect, the method includes forming a pad having a hole for light transmission on a first surface of the circuit substrate; applying optical firing paste to the pad; mounting the electronic component on the circuit substrate in a state where the terminal electrode of the electronic component faces the pad via the optical firing paste; and emitting ultraviolet light from a second surface that is a surface opposite to the first surface of the circuit substrate to cause photocuring of the optical firing paste.

In yet another exemplary aspect, a method is provided for manufacturing an electronic device by mounting on a circuit substrate an electronic component having a base material and a terminal electrode formed on a first surface of the base material. In this aspect, the method includes forming a through hole in the electronic component that extends from the first surface of the base material of the electronic component to a second surface that is a surface opposite to the first surface of the base material of the electronic component, including the terminal electrode; forming a pad on a first surface of the circuit substrate; applying optical firing paste to the pad; mounting the electronic component on the circuit substrate in a state where the terminal electrode of the electronic component faces the pad via the optical firing paste; and emitting ultraviolet light from the second surface of the base material of the electronic component to cause photocuring of the optical firing paste.

In yet another exemplary aspect, a method is provided for manufacturing an electronic device by mounting on a circuit substrate an electronic component having a base material. In this aspect, the method includes configuring the base material with a light transmissive material that transmits ultraviolet light; forming on a first surface of the base material a terminal electrode having a hole for light transmission; forming a pad on a first surface of the circuit substrate; forming optical firing paste to the pad; mounting the electronic component on the circuit substrate in a state where the terminal electrode of the electronic component faces the pad via the optical firing paste; and emitting ultraviolet light from a second surface that is a surface opposite to the first surface of the base material of the electronic component to cause photocuring of the optical firing paste.

According to the exemplary aspects of the present invention, the manufacturing efficiency is improved for manufacturing an electronic device configured with an electronic component having a base material and a terminal electrode formed on the base material, and a circuit substrate on which a pad for mounting the electronic component are formed.

BRIEF DESCRIPTION OF DRAWINGS

FIG. 2 is a plan view illustrating a configuration of pads 71P and the like.

DETAILED DESCRIPTION OF EMBODIMENTS

Figure 1A:
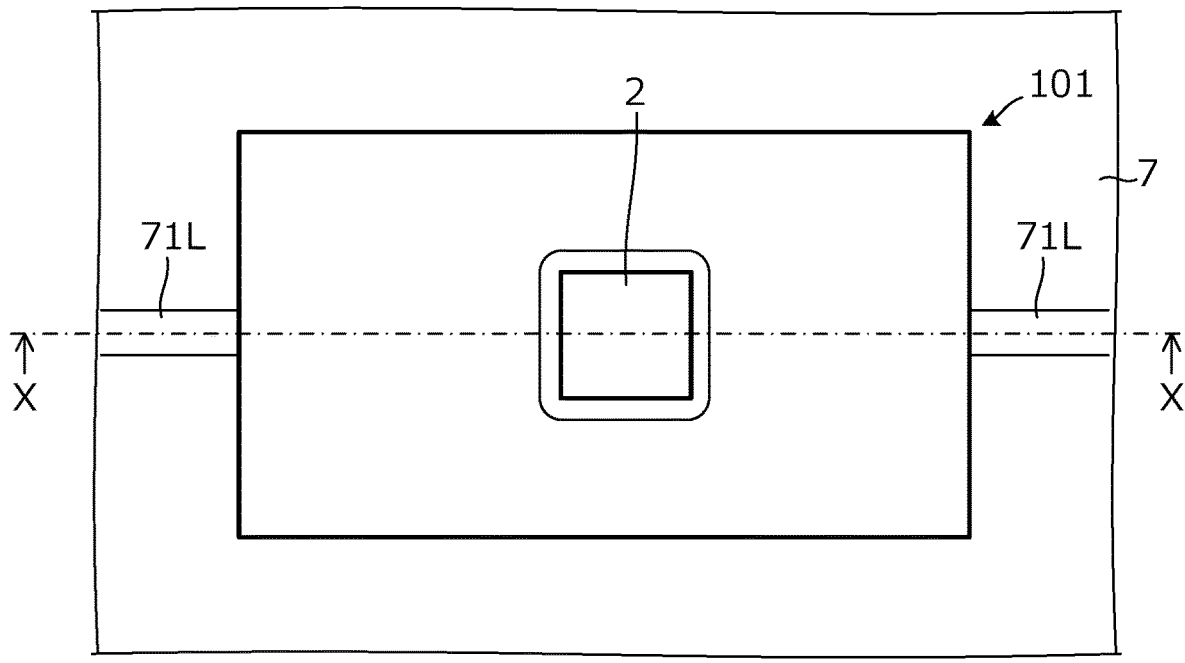
FIG. 1A is a plan view of an electronic device 201 according to a first embodiment.

Hereinafter, a plurality of exemplary aspects of the present invention will be described using specific examples with reference to the drawings. In the drawings, the same portions are denoted by the same reference signs. In consideration of description of main points or ease of understanding, an embodiment is divided into a plurality of embodiments for convenience of description, though partial replacement or combination of configurations shown in different embodiments is possible. In the second and subsequent embodiments, descriptions of matters common with the first embodiment will be omitted, and only different points will be described. In particular, similar operations and effects by similar configurations will not be sequentially mentioned for each embodiment.

First Exemplary Embodiment

Figure 1B:
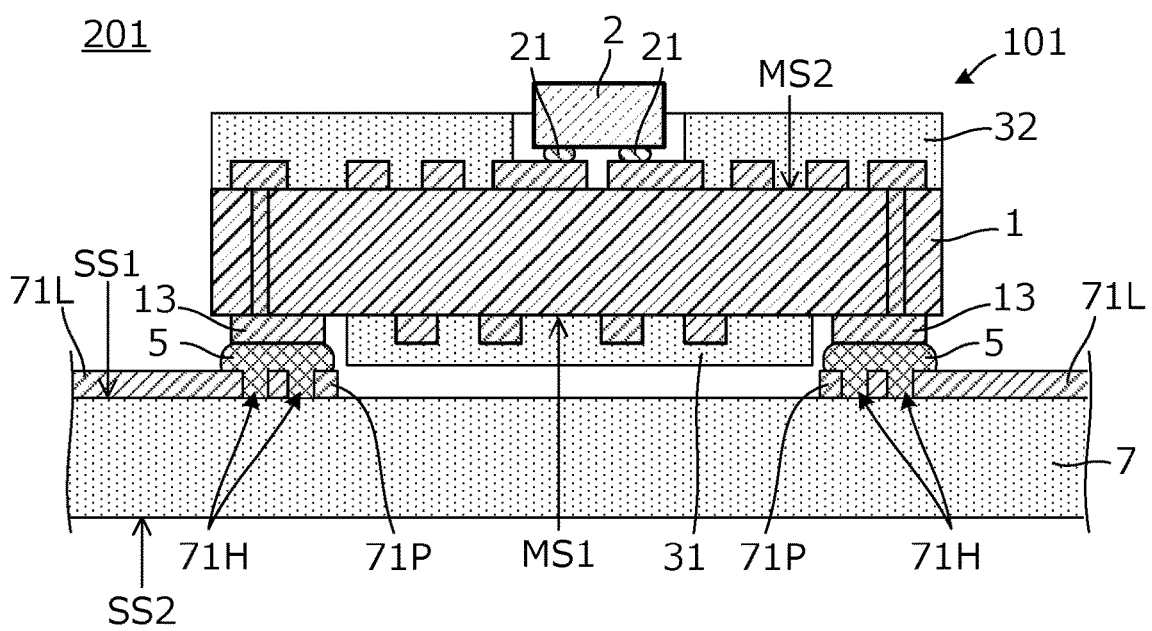
FIG. 1B is a longitudinal sectional view taken along line X-X in FIG. 1A.

FIG. 1A is a plan view of an electronic device 201 according to the first exemplary embodiment. FIG. 1B is a longitudinal sectional view taken along line X-X in FIG. 1A.

As shown, the electronic device 201 is configured with a circuit substrate 7 and an electronic component 101 mounted on the circuit substrate 7. The electronic component 101 includes a base material 1 and an IC 2 mounted on the base material 1. The base material 1 has a first surface MS1 and a second surface MS2 opposite to the first surface. Predetermined conductor patterns are formed on the first surface MS1 and the second surface MS2 of the base material 1. An interlayer connection conductor is formed inside the base material 1. Moreover, a resist film 31 for covering a formation region of a predetermined conductor pattern is formed on the first surface MS1 of the base material 1, and a resist film 32 for covering a formation region of a predetermined conductor pattern is formed on the second surface MS2 of the base material 1.

In an exemplary aspect, the base material 1 is, for example, a flexible substrate having polyimide with a thickness of 20 μm as a base material, and the conductor pattern, an interlayer connection conductor, and the like are formed of copper.

As further shown, the IC 2 is mounted on a part of the conductor pattern formed on the second surface MS2 of the base material 1. A part of the conductor formed on the first surface MS1 is terminal electrodes 13. That is, the electronic component 101 is an electronic component having the terminal electrodes 13 for mounting the electronic component 101 on the circuit substrate 7.

The circuit substrate 7 has a first surface SS1 and a second surface SS2 opposite to the first surface SS1. A predetermined conductor pattern is formed on the first surface SS1 of the circuit substrate 7. Pads 71P formed on the first surface SS1 of the circuit substrate 7 are a part of the conductor pattern in the exemplary aspect.

The circuit substrate 7 is, for example, a polyethylene terephthalate (PET) film having a thickness of 38 μm, and the conductor pattern is formed by patterning of an aluminum foil.

As illustrated in FIG. 1B, the IC 2 is mounted on the second surface MS2 of the base material 1 via terminal electrodes 21 of the IC 2. The terminal electrodes 13 of the electronic component 101 and the pads 71P of the circuit substrate 7 are electrically and mechanically joined to each other with cured products 5 of optical firing paste. Hereinafter, the structure of the joint portion and the joining method will be described.

Figure 2:
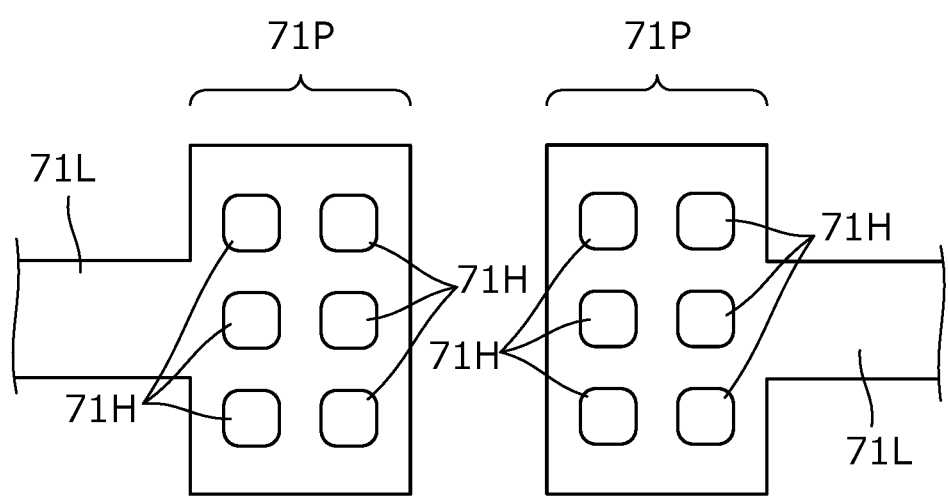

FIG. 2 is a plan view illustrating a configuration of the pads 71P and the like. As shown, a plurality of holes 71H for light transmission are formed in the pads 71P. Moreover, conductor patterns 71L are drawn out from the pads 71P.

Figure 3A:
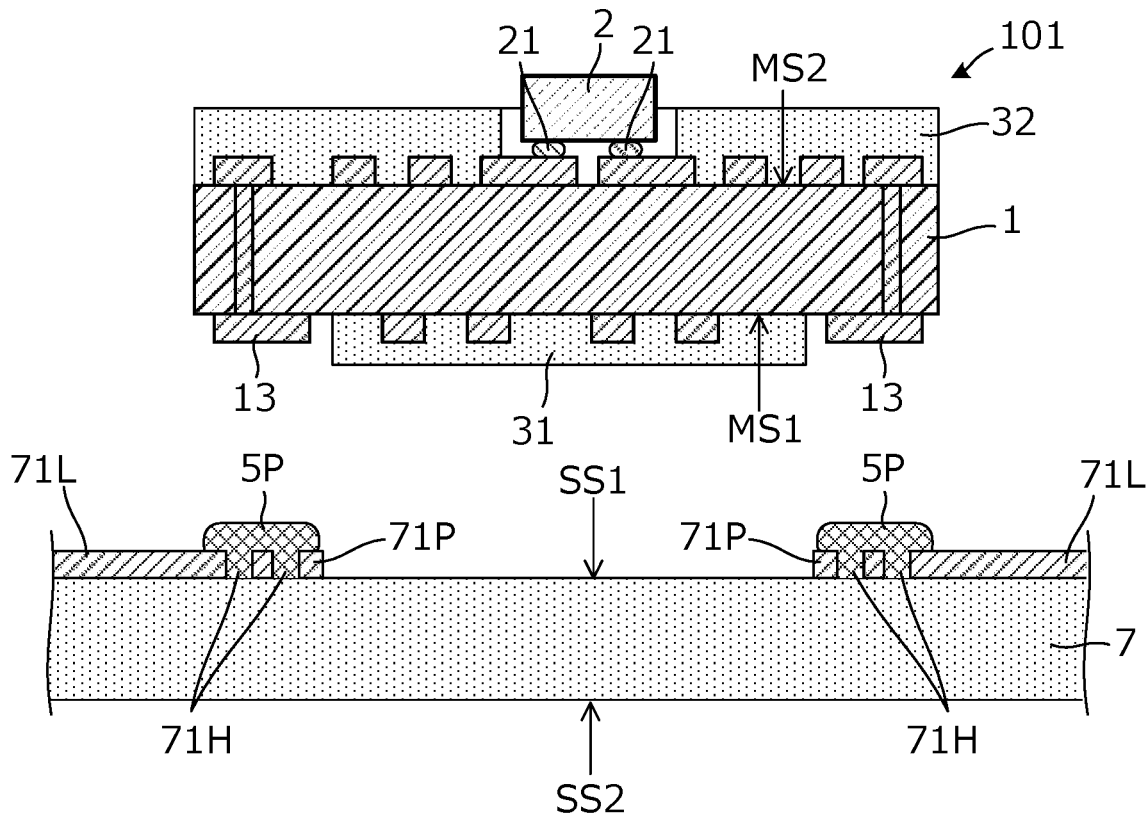
FIG. 3A is a sectional view illustrating a state before an electronic component 101 is mounted on a circuit substrate 7.
Figure 3B:
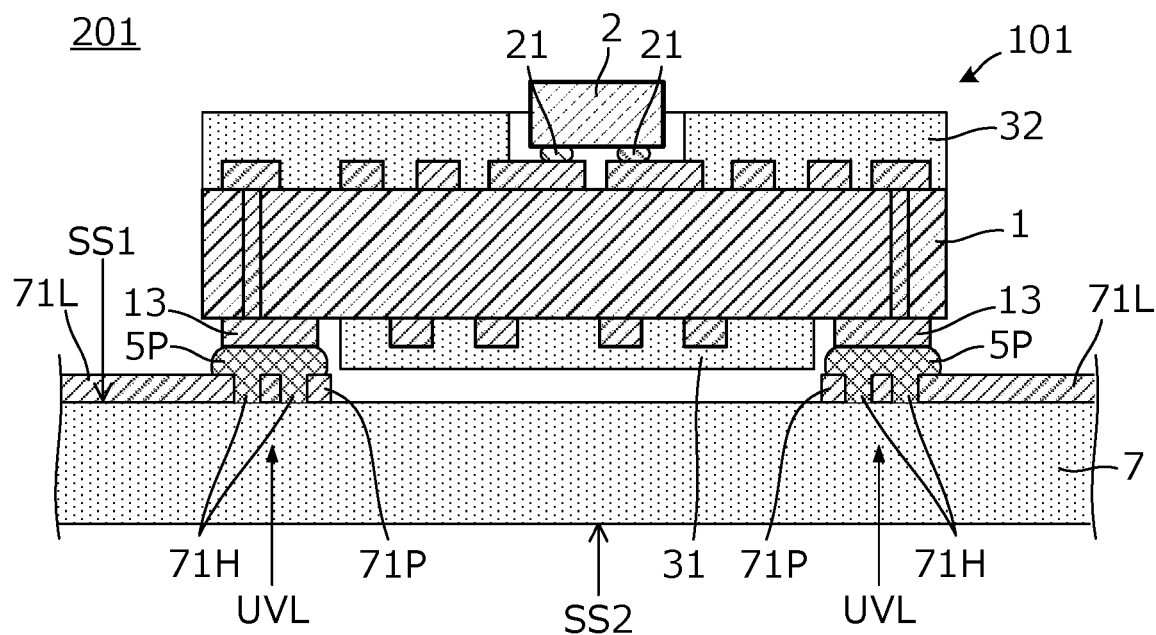
FIG. 3B is a sectional view illustrating a state after the electronic component 101 is mounted.

FIG. 3A is a sectional view illustrating a state before the electronic component 101 is mounted on the circuit substrate 7, and FIG. 3B is a sectional view illustrating a state after the electronic component 101 is mounted. As illustrated in FIG. 3A, optical firing paste 5P is applied and formed on surfaces of the pads 71P on the circuit substrate 7. The optical firing paste 5P is a paste obtained by kneading a conductive filler such as silver with a cuprous oxide paste for optical firing, and is cured by ultraviolet light. The optical firing paste 5P is printed by a screen mask printing method or with a dispenser. The ultraviolet light UVL is, for example, ultraviolet light having a wavelength of 200 nm to 600 nm in an exemplary aspect.

Then, as illustrated in FIG. 3B, the electronic component 101 is mounted on the circuit substrate 7 in a state where the terminal electrodes 13 of the electronic component 101 face the pads 71P on the circuit substrate 7, that is, in a state where the pads 71P on the circuit substrate 7 face the terminal electrodes 13 of the electronic component 101 via the optical firing paste 5P. Furthermore, in this state, the ultraviolet light UVL is emitted from the second surface SS2 side of the circuit substrate 7 as illustrated in FIG. 3B. As a result, the optical firing paste 5P is cured. FIG. 1B illustrates this state. That is, the terminal electrodes 13 of the electronic component 101 and the pads 71P of the circuit substrate 7 are electrically and mechanically joined to each other with cured products 5 of the optical firing paste.

Figure 4A:
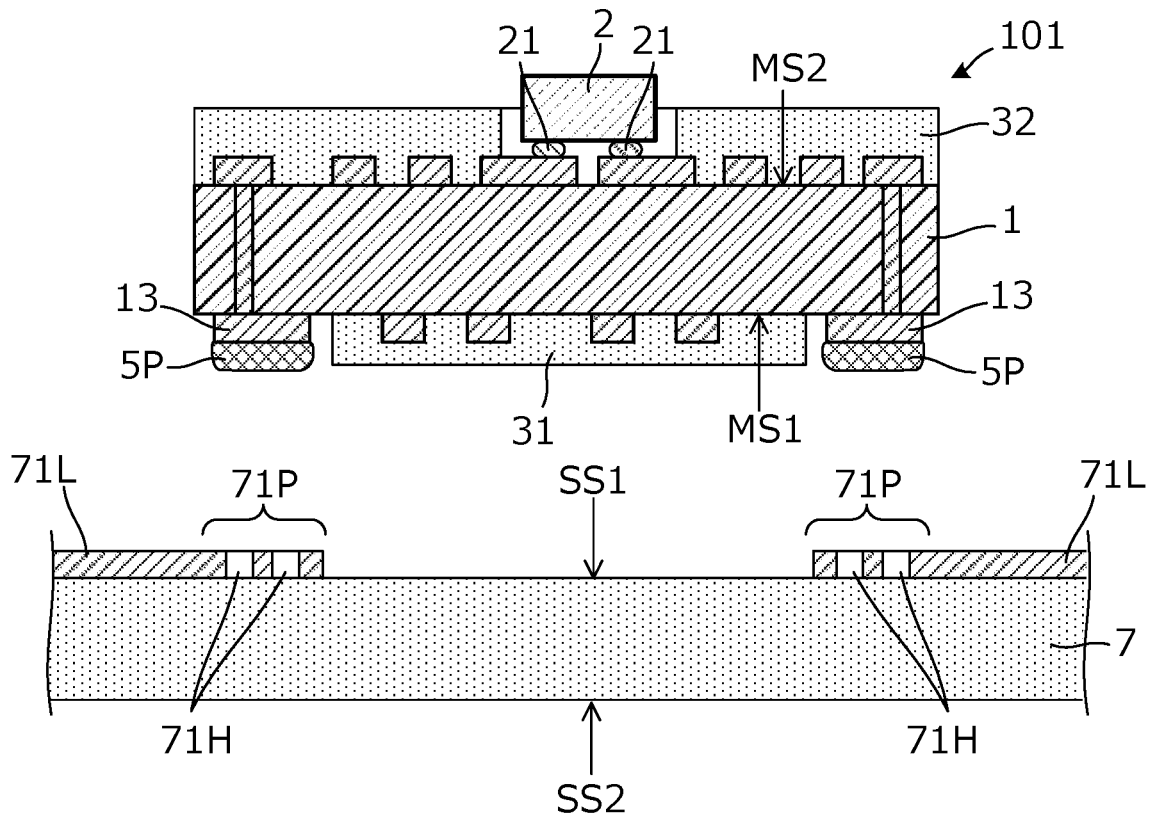
FIG. 4A is a sectional view illustrating a state before an electronic component 101 is mounted on a circuit substrate 7.
Figure 4B:
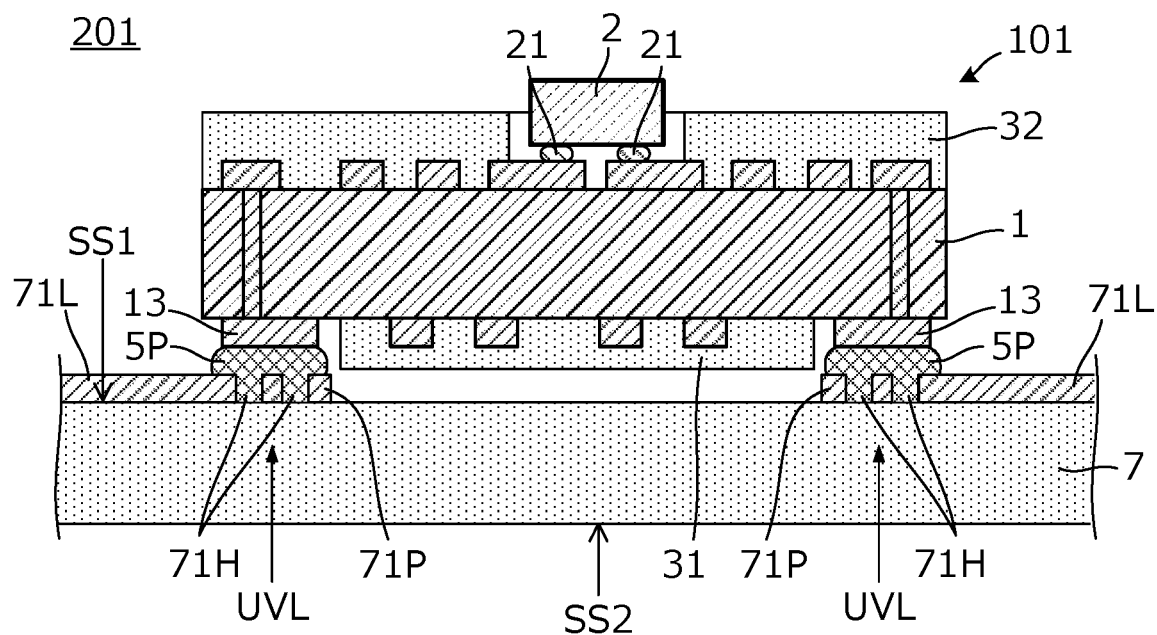
FIG. 4B is a sectional view illustrating a state after the electronic component 101 is mounted.

Although the optical firing paste 5P is formed on the pad 71P side of the circuit substrate 7 in the example illustrated in FIGS. 3A and 3B, the optical firing paste 5P may be formed on the terminal electrode 13 side of the electronic component 101. An example thereof will be described below. FIG. 4A is a sectional view illustrating a state before the electronic component 101 is mounted on the circuit substrate 7, and FIG. 4B is a sectional view illustrating a state after the electronic component 101 is mounted. As illustrated in FIG. 4A, the optical firing paste 5P is applied and formed on surfaces of the terminal electrodes 13 of the electronic component 101.

During manufacturing of the electronic component 101, a plurality of electronic components 101 are manufactured in an aggregate substrate state in which the electronic components 101 are arranged longitudinally and laterally. That is, the optical firing paste 5P is formed on the large number of terminal electrodes 13 in the aggregate substrate state by a screen mask printing method or with a dispenser.

Then, as illustrated in FIG. 4B, the electronic component 101 is mounted on the circuit substrate 7. In this state, the ultraviolet light UVL is emitted from the second surface SS2 side of the circuit substrate 7, so that the optical firing paste 5P is cured as illustrated in FIG. 4B.

Figure 5A:
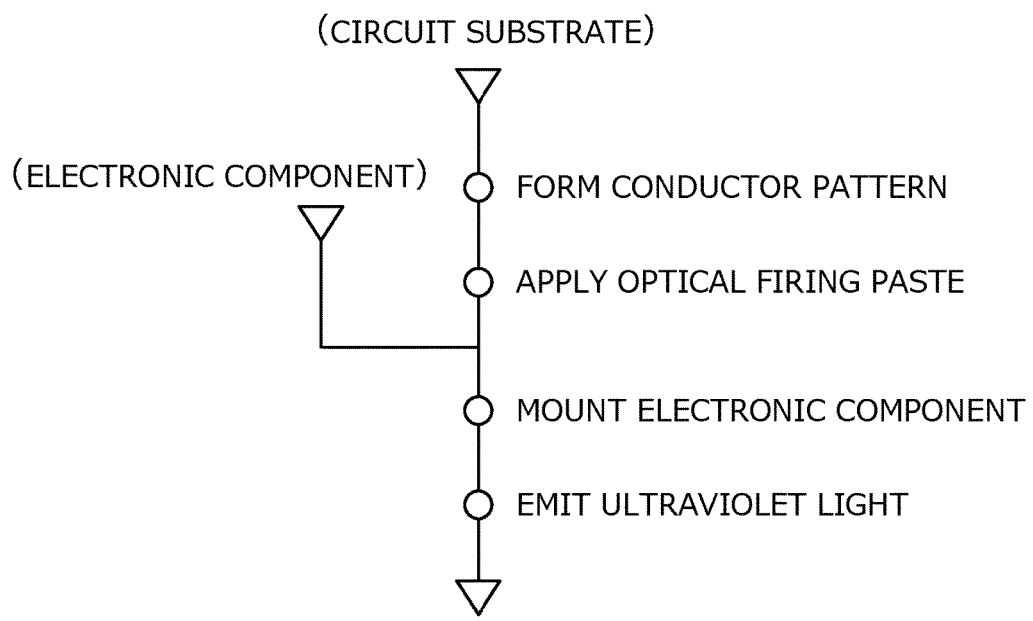
FIGS. 5A and 5B are diagrams illustrating the manufacturing procedure of an electronic device according to the first embodiment.
Figure 5B:
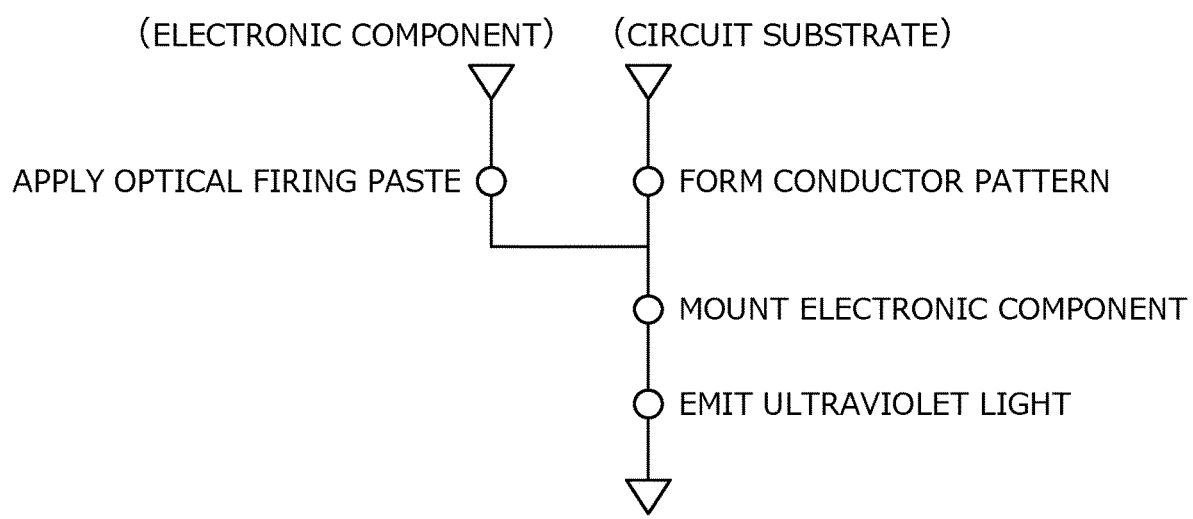

FIGS. 5A and 5B are diagrams illustrating the manufacturing procedure of an electronic device according to the first embodiment. In particular, the procedure illustrated in FIG. 5A corresponds to the example illustrated in FIGS. 3A and 3B, and the procedure illustrated in FIG. 5B corresponds to the example illustrated in FIGS. 4A and 4B.

In the procedure illustrated in FIG. 5A, first, for the circuit substrate 7, a conductor pattern is formed on the circuit substrate 7, and the optical firing paste 5P is applied to the pads 71P. Then, the electronic component 101 is mounted, and ultraviolet light UVL is emitted from the second surface SS2 side of the circuit substrate 7.

In the procedure illustrated in FIG. 5B, for the circuit substrate 7, a conductor pattern is formed on the circuit substrate 7. For the electronic component, the optical firing paste 5P is applied to the terminal electrodes 13. Then, the electronic component 101 is mounted on the circuit substrate 7, and ultraviolet light UVL is emitted from the second surface SS2 side of the circuit substrate 7.

Second Exemplary Embodiment

In a second embodiment, an electronic device having an emission direction of ultraviolet light during manufacturing different from that in the first embodiment will be described.

Figure 6A:
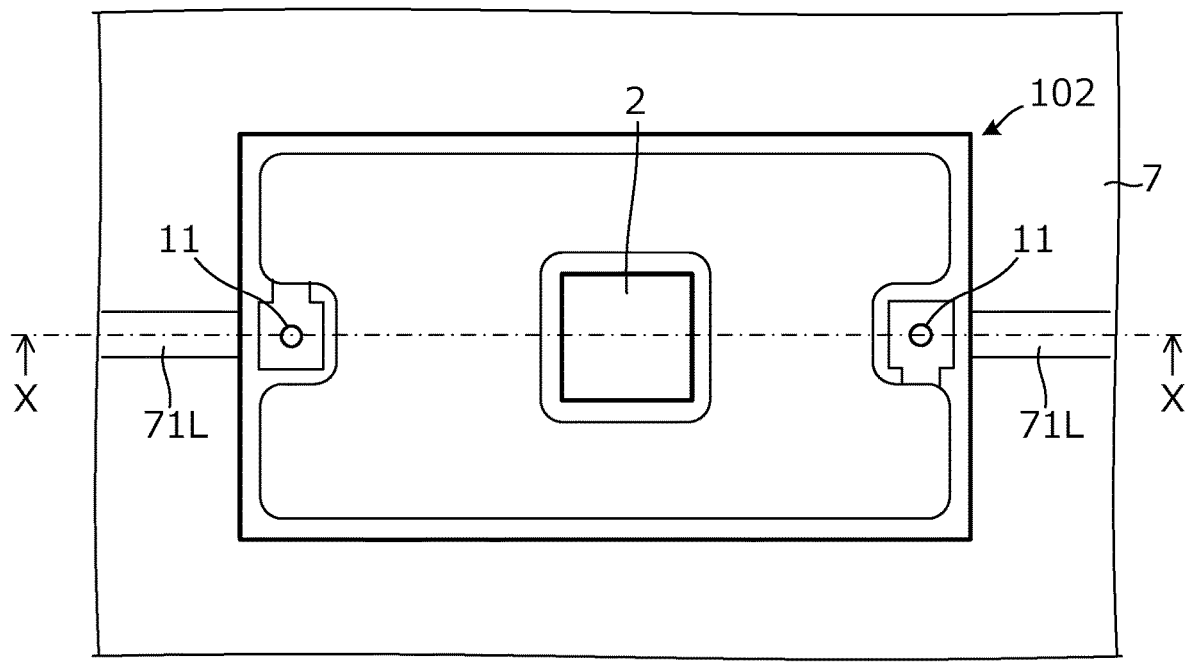
FIG. 6A is a plan view of an electronic device 202 according to a second embodiment.
Figure 6B:
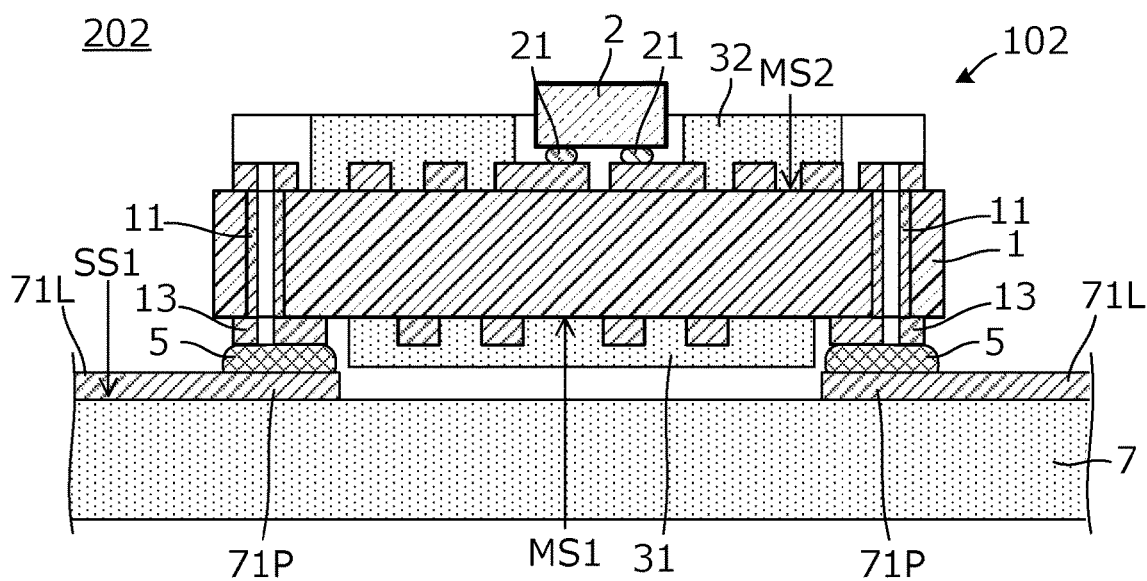
FIG. 6B is a longitudinal sectional view taken along line X-X in FIG. 6A.

FIG. 6A is a plan view of an electronic device 202 according to the second exemplary embodiment. FIG. 6B is a longitudinal sectional view taken along line X-X in FIG. 6A.

In the exemplary aspect, the electronic device 202 is configured with a circuit substrate 7 and an electronic component 102 mounted on the circuit substrate 7. The electronic component 102 includes a base material 1 and an IC 2 mounted on the base material 1. The base material 1 has a first surface MS1 and a second surface MS2 opposite to the first surface. Predetermined conductor patterns are formed on the first surface MS1 and the second surface MS2 of the base material 1. As further shown, through holes 11 having a conductor film formed on the inner peripheral surface thereof are formed inside the base material 1. Moreover, a resist film 31 for covering a formation region of a predetermined conductor pattern is formed on the first surface MS1 of the base material 1, and a resist film 32 for covering a formation region of a predetermined conductor pattern is formed on the second surface MS2 of the base material 1.

In this exemplary aspect, the base material 1 is, for example, a flexible substrate having polyimide with a thickness of 20 μm as a base material, and the conductor pattern, an interlayer connection conductor, and the like are formed of copper.

The IC 2 is mounted on a part of the conductor pattern formed on the second surface MS2 of the base material 1. Moreover, a part of the conductor formed on the first surface MS1 is terminal electrodes 13.

The circuit substrate 7 has a first surface SS1 with a predetermined conductor pattern formed on the first surface SS1 of the circuit substrate 7. Pads 71P formed on the first surface SS1 of the circuit substrate 7 are a part of the conductor pattern. The holes 71H as illustrated in FIG. 2 in the first embodiment are not formed in the pads 71P in this exemplary aspect.

The circuit substrate 7 is, for example, a polyethylene terephthalate (PET) film having a thickness of 38 μm, and the conductor pattern is formed by patterning of an aluminum foil.

The terminal electrodes 13 of the electronic component 102 and the pads 71P of the circuit substrate 7 are electrically and mechanically joined to each other with cured products 5 of optical firing paste as illustrated in FIG. 6B. Hereinafter, the structure of the joint portion and the joining method will be described.

Figure 7A:
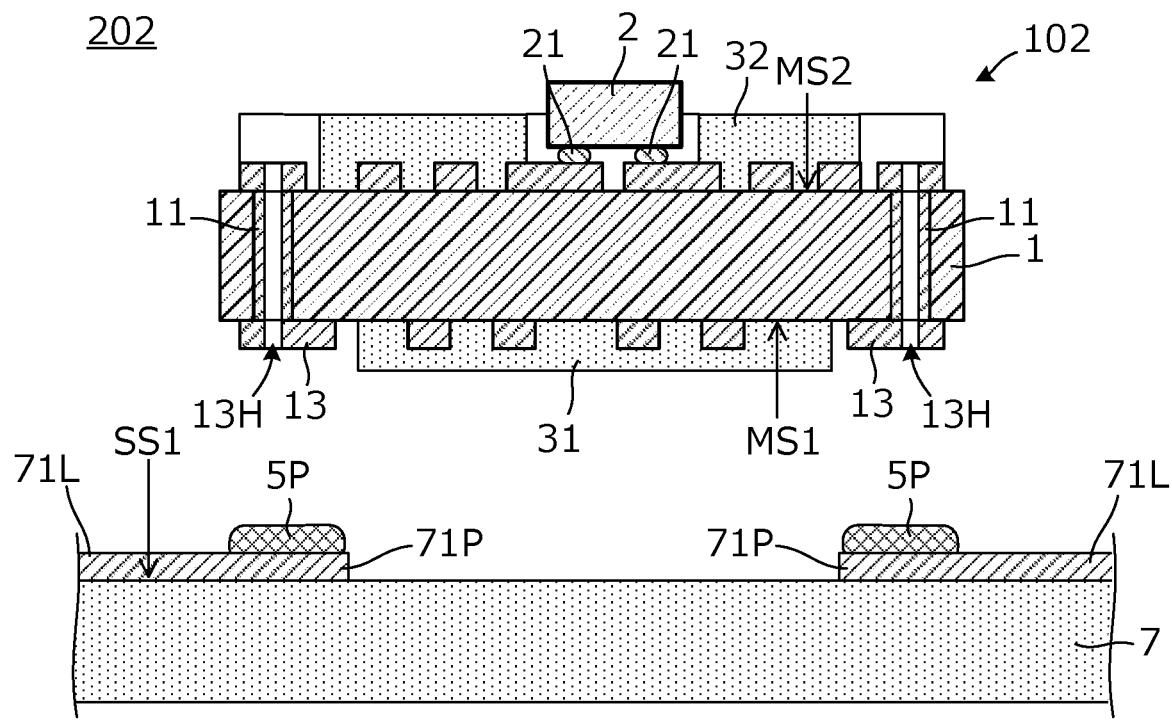
FIG. 7A is a sectional view illustrating a state before an electronic component 102 is mounted on a circuit substrate 7.
Figure 7B:
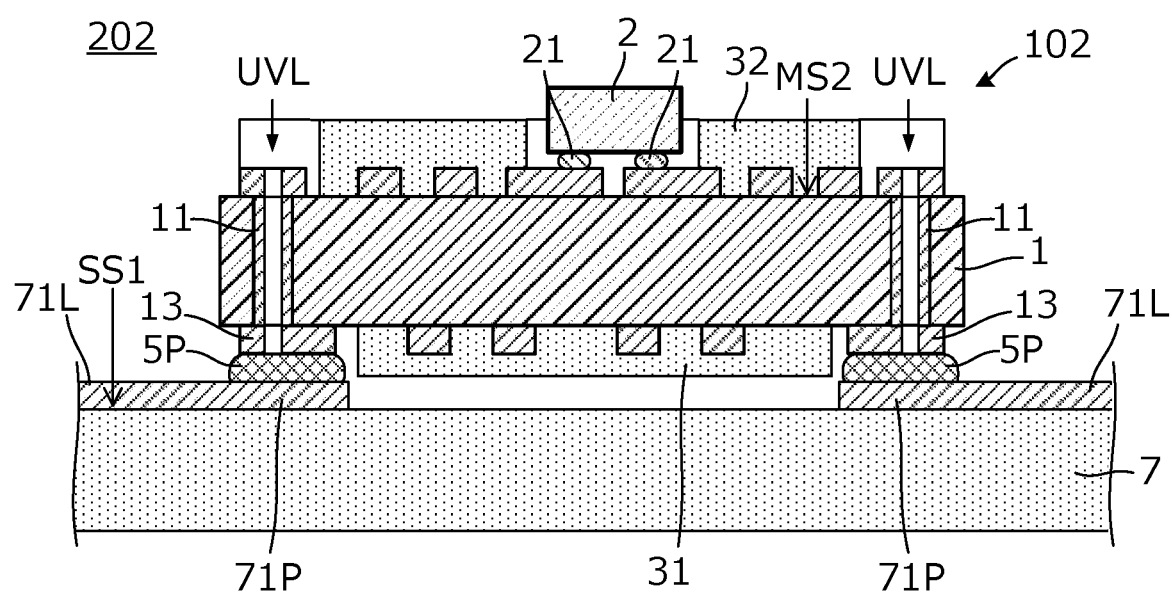
FIG. 7B is a sectional view illustrating a state after the electronic component 102 is mounted.

FIG. 7A is a sectional view illustrating a state before the electronic component 102 is mounted on the circuit substrate 7, and FIG. 7B is a sectional view illustrating a state after the electronic component 102 is mounted. In the terminal electrodes 13 of the electronic component 102, holes 13H for light transmission are formed at positions overlapped with the through holes 11. As illustrated in FIG. 7A, optical firing paste 5P is applied and formed on surfaces of the pads 71P on the circuit substrate 7. The optical firing paste 5P is a paste obtained by kneading a conductive filler such as silver with a cuprous oxide paste for optical firing, and is cured by ultraviolet light.

Then, as illustrated in FIG. 7B, the electronic component 102 is mounted on the circuit substrate 7 in a state where the terminal electrodes 13 of the electronic component 102 face the pads 71P on the circuit substrate 7, that is, in a state where the pads 71P on the circuit substrate 7 face the terminal electrodes 13 of the electronic component 102 via the optical firing paste 5P. Furthermore, in this state, ultraviolet light UVL is emitted from the second surface MS2 side of the electronic component 102 as illustrated in FIG. 7B. The ultraviolet light UVL is emitted to the optical firing paste 5P through the through holes 11 and the holes 13H of the terminal electrodes 13. As a result, the optical firing paste 5P is cured. FIG. 6B illustrates this state. That is, the terminal electrodes 13 of the electronic component 102 and the pads 71P of the circuit substrate 7 are electrically and mechanically joined to each other with the cured products 5 of the optical firing paste. As described above, the through holes 11 not only make interlayer connection between the conductor pattern formed on the first surface MS1 of the base material 1 and the conductor pattern formed on the second surface MS2, but also act as light transmission paths of the ultraviolet light UVL.

Although the optical firing paste 5P is formed on the pad 71P side of the circuit substrate 7 in the example illustrated in FIGS. 7A and 7B, the optical firing paste 5P can be formed on the terminal electrode 13 side of the electronic component 102 in an alternative aspect.

Third Exemplary Embodiment

In a third embodiment, an electronic device including an electronic component having a base material that transmits ultraviolet light will be described.

Figure 8A:
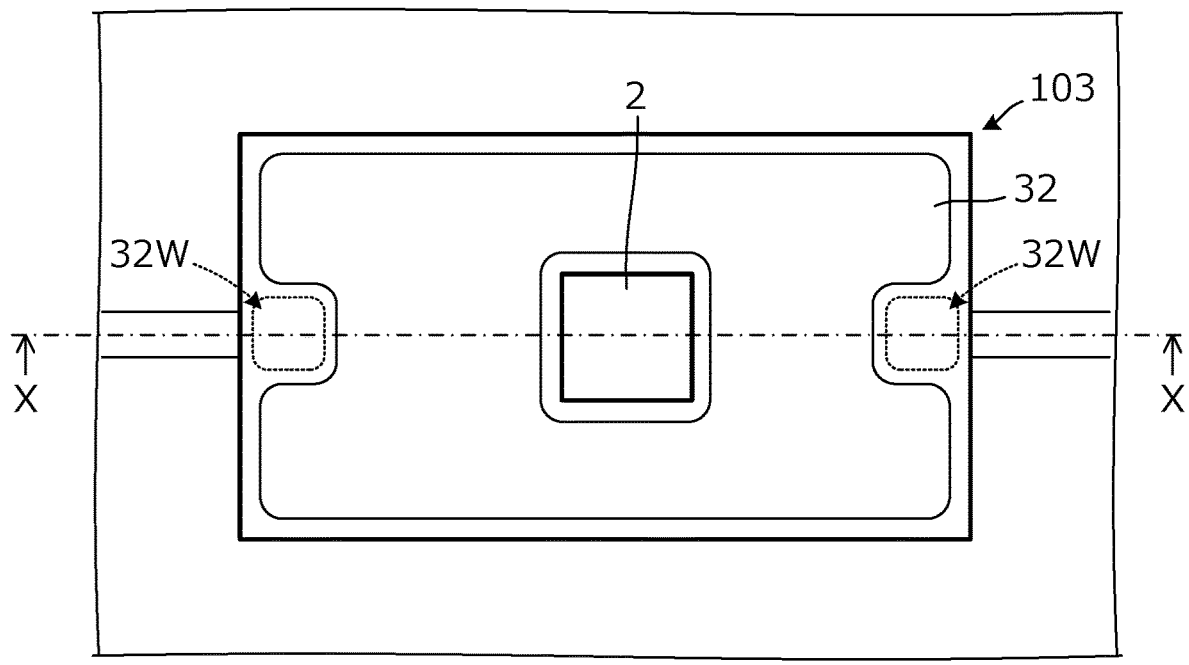
FIG. 8A is a plan view of an electronic device 203 according to a third embodiment.
Figure 8B:
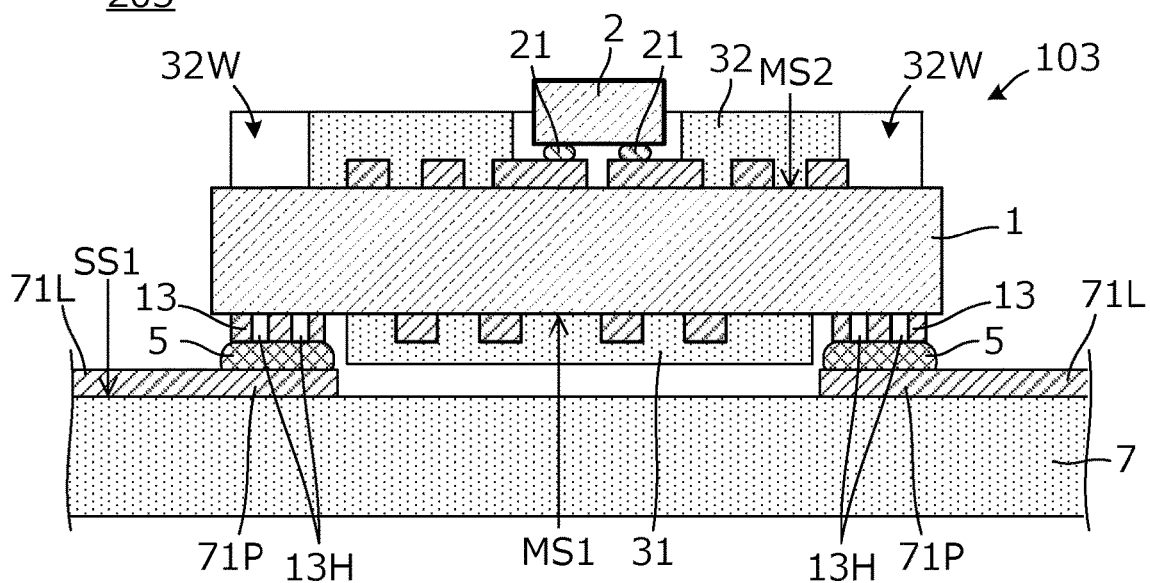
FIG. 8B is a longitudinal sectional view taken along line X-X in FIG. 8A.

FIG. 8A is a plan view of an electronic device 203 according to the third embodiment. FIG. 8B is a longitudinal sectional view taken along line X-X in FIG. 8A.

The electronic device 203 is configured with a circuit substrate 7 and an electronic component 103 mounted on the circuit substrate 7. The electronic component 103 includes a base material 1 and an IC 2 mounted on the base material 1. The base material 1 has a first surface MS1 and a second surface MS2 opposite to the first surface. Moreover, predetermined conductor patterns are formed on the first surface MS1 and the second surface MS2 of the base material 1. A resist film 31 for covering a formation region of a predetermined conductor pattern is formed on the first surface MS1 of the base material 1, and a resist film 32 for covering a formation region of a predetermined conductor pattern is formed on the second surface MS2 of the base material 1.

In the exemplary aspect, the base material 1 is made of a light transmissive material. More particularly, the base material 1 is, for example, a transparent polyimide film. Windows 32W for light transmission are formed in the pattern of the resist film 32.

The IC 2 is mounted on a part of the conductor pattern formed on the second surface MS2 of the base material 1. A part of the conductor formed on the first surface MS1 is terminal electrodes 13.

The circuit substrate 7 has a first surface SS1. A predetermined conductor pattern is formed on the first surface SS1 of the circuit substrate 7. Pads 71P formed on the first surface SS1 of the circuit substrate 7 are a part of the conductor pattern.

The terminal electrodes 13 of the electronic component 103 and the pads 71P of the circuit substrate 7 are electrically and mechanically joined to each other with cured products 5 of optical firing paste as illustrated in FIG. 8B. Hereinafter, the structure of the joint portion and the joining method will be described.

Figure 9A:
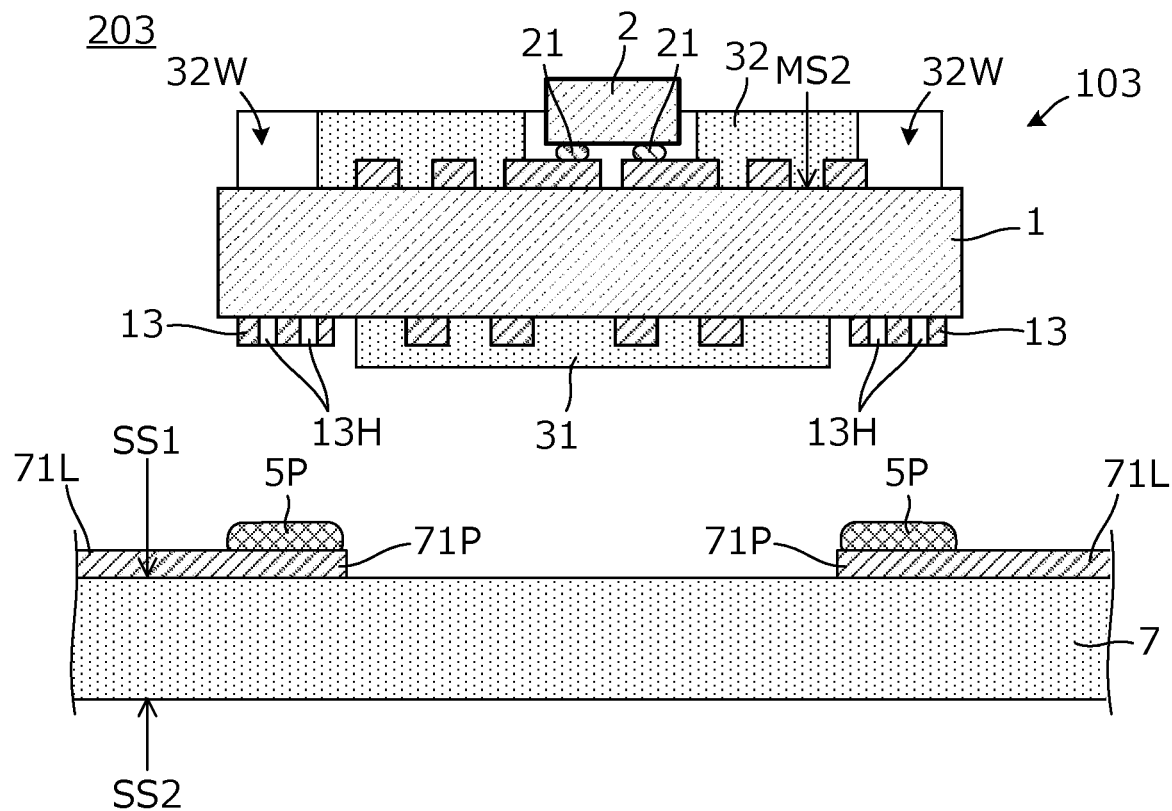
FIG. 9A is a sectional view illustrating a state before an electronic component 103 is mounted on a circuit substrate 7.
Figure 9B:
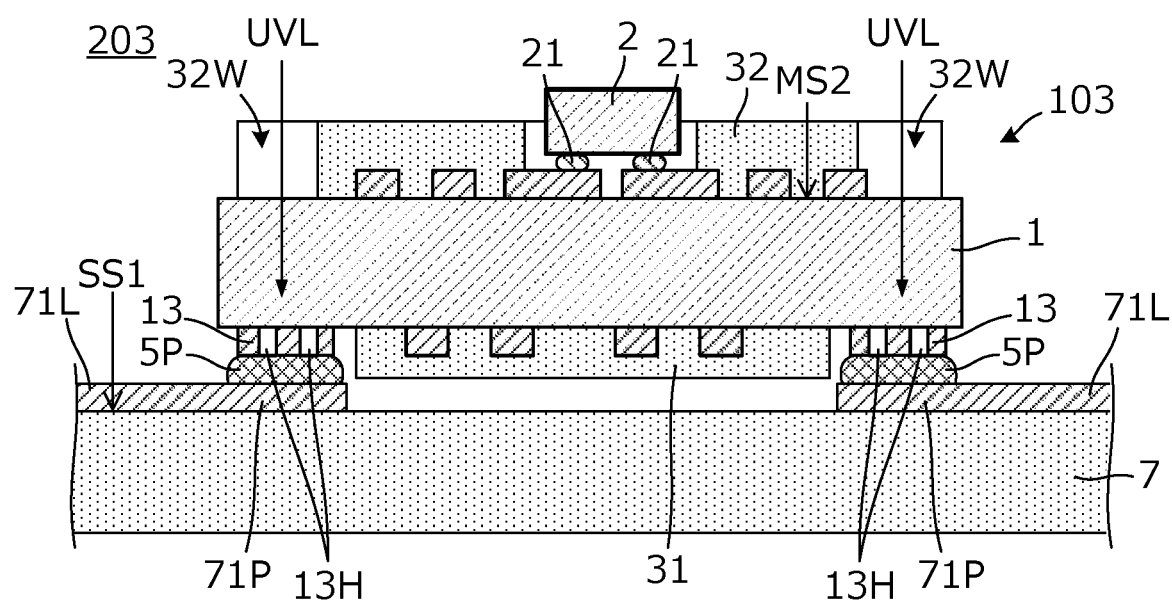
FIG. 9B is a sectional view illustrating a state after the electronic component 103 is mounted.

FIG. 9A is a sectional view illustrating a state before the electronic component 103 is mounted on the circuit substrate 7, and FIG. 9B is a sectional view illustrating a state after the electronic component 103 is mounted. As further shown, a plurality of holes 13H for light transmission are formed in the terminal electrodes 13 of the electronic component 103. As illustrated in FIG. 9A, optical firing paste 5P is applied and formed on surfaces of the pads 71P on the circuit substrate 7. The optical firing paste 5P is a paste obtained by kneading a conductive filler, such as silver, with a cuprous oxide paste for optical firing, and is cured by ultraviolet light.

Then, as illustrated in FIG. 9B, the electronic component 103 is mounted on the circuit substrate 7 in a state where the terminal electrodes 13 of the electronic component 103 face the pads 71P on the circuit substrate 7, that is, in a state where the pads 71P on the circuit substrate 7 face the terminal electrodes 13 of the electronic component 103 via the optical firing paste 5P. Furthermore, in this state, ultraviolet light UVL is emitted from the second surface MS2 side of the electronic component 103 as illustrated in FIG. 9B. The ultraviolet light UVL is emitted to the optical firing paste 5P through the windows 32W for light transmission and the holes 13H of the terminal electrodes 13. As a result, the optical firing paste 5P is cured. FIG. 8B illustrates this state. That is, the terminal electrodes 13 of the electronic component 103 and the pads 71P of the circuit substrate 7 are electrically and mechanically joined to each other with the cured products 5 of the optical firing paste.

Although the optical firing paste 5P is formed on the pad 71P side of the circuit substrate 7 in the example illustrated in FIGS. 9A and 9B, the optical firing paste 5P may be formed on the terminal electrode 13 side of the electronic component 103 in an alternative aspect.

Fourth Exemplary Embodiment

In a fourth exemplary embodiment, an RFIC module for an RFID tag, and an RFID tag including the RFIC module will be exemplified.

Figure 10:
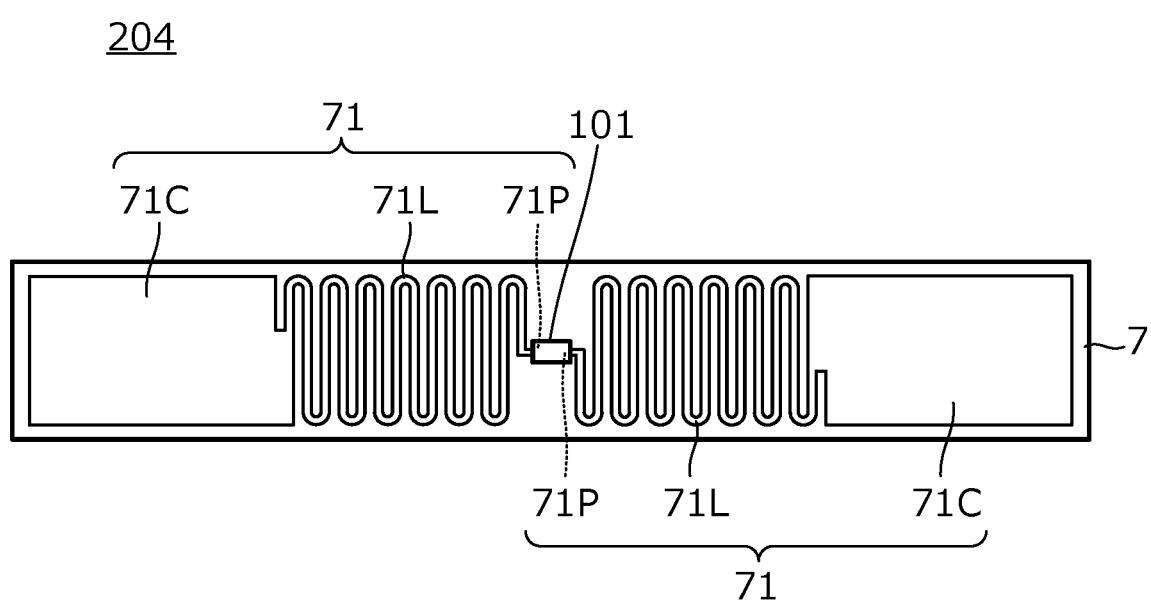
FIG. 10 is a plan view of an electronic device 204 that acts as an RFID tag according to a fourth embodiment.

FIG. 10 is a plan view of an electronic device 204 that acts as an RFID tag according to the fourth embodiment. As shown, antenna conductor patterns 71 are formed on a circuit substrate 7, and the antenna conductor patterns 71 constitute antennas. The circuit substrate 7 is, for example, a polyethylene terephthalate (PET) film, and the antenna conductor patterns 71 are, for example, patterns of a metal foil such as a copper foil.

Each antenna conductor pattern 71 is configured with conductor patterns 71C and 71L, and a pad 71P. The antenna conductor pattern 71 constitutes a dipole antenna. An electronic component 101 as an RFIC module is mounted on the pad 71P as illustrated in FIG. 1B in the first embodiment. The conductor pattern 71L has a meander line shape and acts as a region having a high inductance component. Moreover, the conductor pattern 71C has a planar shape and acts as a region having a high capacitance component.

Figure 11:
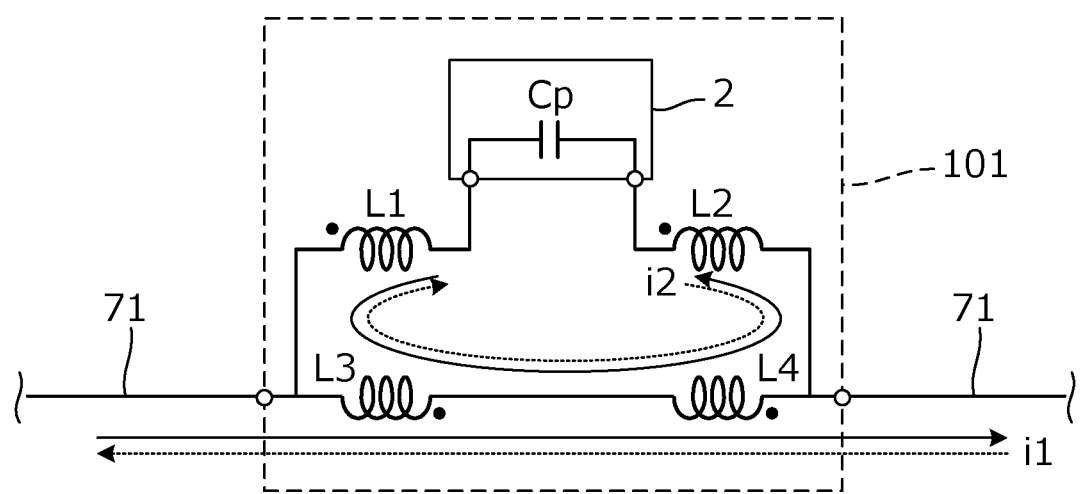
FIG. 11 is an equivalent circuit diagram of an electronic component 101 part in the electronic device 204.

FIG. 11 is an equivalent circuit diagram of an electronic component 101 part in the electronic device 204. An IC 2 is an RFIC for an RFID, and has an equivalent capacitance Cp between two terminals. Inductors L1, L2, L3, and L4 form an impedance matching circuit, and two resonances are generated in a state where the impedance matching circuit and the antenna conductor patterns 71 are connected to the IC 2. A first resonance is a resonance generated in a current path configured with the antenna conductor patterns 71, the inductor L3, and the inductor L4, and a second resonance is a resonance generated in a current path (e.g., a current loop) configured with the inductors L1 to L4. The two resonances are coupled by the inductors L3 and L4 shared by the current paths, and two currents i1 and i2 respectively corresponding to the two resonances flow as illustrated in FIG. 11.

Figure 12:
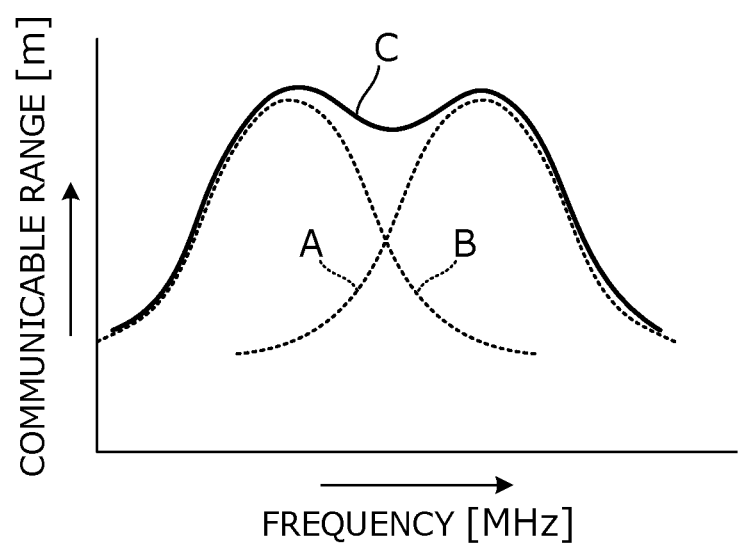
FIG. 12 is a diagram illustrating two resonance frequencies to be generated by providing an impedance matching circuit.

Both the frequency of the first resonance and the frequency of the second resonance are affected by the inductors L3 and L4. A difference of several tens MHz (specifically, approximately 5 to 50 MHz) is generated between the frequency of the first resonance and the frequency of the second resonance. FIG. 12 is a diagram illustrating two resonance frequencies to be generated by providing the impedance matching circuit. The resonance frequency characteristics thereof are expressed by curve A and curve B in FIG. 12. By coupling two resonances having such resonance frequencies, a broadband resonance frequency characteristic as indicated by curve C in FIG. 12 is obtained.

Finally, it is noted generally that the above description of the exemplary embodiments is illustrative in all respects and is not restrictive. Modifications and changes can be made as appropriate by those skilled in the art.

For example, although the above embodiments have illustrated examples in which ultraviolet light is emitted from the second surface MS2 of the base material 1 of the electronic component or from the second surface SS2 of the circuit substrate 7, ultraviolet light may be emitted from both the second surface MS2 of the base material 1 of the electronic component and the second surface SS2 of the circuit substrate 7 by combining the first embodiment and the second embodiment or by combining the first embodiment and the third embodiment as would be appreciated to one skilled in the art.

Moreover, although an electronic device including an electronic component having a light non-transmissive resist film has been exemplified in the second embodiment and the third embodiment, a light transmissive resist film may be used. In this case, also in the second embodiment and the third embodiment, as illustrated in FIGS. 1A and 1B, the resist film 32 may be formed on the entire surface of the second surface MS2 of the base material 1 except for the region where the IC 2 is mounted.

REFERENCE SIGNS LIST

L1, L2, L3, L4 inductor
MS1 first surface of base material of electronic component
MS2 second surface of base material of electronic component
SS1 first surface of substrate
SS2 second surface of substrate
UVL ultraviolet light
1 base material
2 IC
5 cured product of optical firing paste
5P optical firing paste
7 circuit substrate
11 through hole
13 terminal electrode
13H hole for light transmission
21 terminal electrode
31, 32 resist film
32W window for light transmission
71 antenna conductor pattern
71C, 71L conductor pattern
71H hole
71P pad
101, 102, 103 electronic component
201, 202, 203, 204 electronic device

The invention claimed is:

1. An electronic device comprising:
an electronic component having a base material and a terminal electrode disposed on a first surface of the base material; and
a circuit substrate in which a pad for mounting the electronic component is disposed on a first surface of the circuit substrate,
wherein the electronic component has a through hole extending from the first surface of the base material of the electronic component to a second surface opposite the first surface of the base material, the through hole electrically connecting the terminal electrode and a conductor pattern disposed on the second surface of the base material,
wherein the pad and the terminal electrode are electrically and mechanically connected to each other with a cured product of an optical firing paste that is disposed between the terminal electrode and a conductor pattern disposed on the first surface of the circuit substrate,
wherein the pad is configured to prevent light from passing therethrough, and
wherein the base material comprises a material that prevents light from passing therethrough.

2. The electronic device according to claim 1, wherein the cured product of the optical firing paste is obtained by receiving light from the second surface of the base material of the electronic component.

3. The electronic device according to claim 2, wherein the pad does not transmit the light that cures the optical firing paste.

4. The electronic device according to claim 3, wherein the material of the base material does not transmit the light that cures the optical firing paste.

5. The electronic device according to claim 1, wherein the terminal electrode comprises at least one hole configured for light transmission.

6. The electronic device according to claim 5, wherein the at least one hole in the terminal electrode overlaps the through hole of the electronic component in a thickness direction thereof.

7. The electronic device according to claim 1, wherein the through hole of the electronic component comprises an interlayer connection conductor.

8. The electronic device according to claim 1, further comprising an IC mounted to the conductor pattern that is disposed on the second surface of the base material.

9. The electronic device according to claim 1, further comprising a resist film disposed on the second surface of the base material for covering the conductor pattern.

10. The electronic device according to claim 9, wherein the resist film comprises at least one window constructed for light transmission.

11. A method for manufacturing an electronic device comprising:
mounting on a circuit substrate an electronic component having a base material that does not transmit an ultraviolet light, with a terminal electrode formed on a first surface of the base material; forming a through hole in the electronic component that extends from the first surface of the base material to a second surface that is opposite to the first surface, such that the through hole electrically connects the terminal electrode to a conductor pattern disposed on the second surface of the base material;

forming a pad on a first surface of the circuit substrate facing the electronic component;

applying an optical firing paste to the pad, such that the optical firing paste is formed between the terminal electrode and a conductor pattern disposed on the first surface of the circuit substrate; mounting the electronic component on the circuit substrate in a state where the terminal electrode of the electronic component faces the pad via the optical firing paste; and emitting an ultraviolet light from the second surface of the base material of the electronic component to cause photo-curing of the optical firing paste.

12. The method according to claim 11, further comprising configuring the pad to not transmit the light that cures the optical firing paste.

13. The method according to claim 11, further comprising forming at least one hole in the terminal electrode for light transmission.

14. The method according to claim 13, further comprising aligning the at least one hole in the terminal electrode with the through hole of the electronic component in a thickness direction thereof.

15. The method according to claim 11, further comprising mounting an IC on the conductor pattern that is disposed on the second surface of the base material.

16. The method according to claim 11, further comprising forming a resist film on the second surface of the base material that covers the conductor pattern and includes at least one window constructed for light transmission.

* * * * *